(12) United States Patent
Pallinti et al.

(10) Patent No.: US 6,607,967 B1
(45) Date of Patent: Aug. 19, 2003

(54) PROCESS FOR FORMING PLANARIZED ISOLATION TRENCH IN INTEGRATED CIRCUIT STRUCTURE ON SEMICONDUCTOR SUBSTRATE

(75) Inventors: Jayanthi Pallinti, Santa Clara, CA (US); Dawn M. Lee, Lake Oswego, OR (US); Ronald J. Nagahara, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 73 days.

(21) Appl. No.: 09/714,000

(22) Filed: Nov. 15, 2000

(51) Int. Cl.[7] ............................................. H01L 21/76
(52) U.S. Cl. .................. 438/411; 438/238; 438/299; 438/429; 438/690; 438/705
(58) Field of Search ............................... 438/411, 238, 438/386, 270, 242, 431, 437, 154, 291, 299, 586, 17, 253, 429, 424, 705, 199, 690, 275, 296

(56) References Cited

U.S. PATENT DOCUMENTS

| | | | |
|---|---|---|---|
| 5,816,900 A | 10/1998 | Nagahara et al. | 451/285 |
| 5,835,226 A | 11/1998 | Berman et al. | 356/382 |
| 5,863,825 A | 1/1999 | Pasch et al. | 438/401 |
| 5,865,666 A | 2/1999 | Nagahara | 451/10 |
| 5,868,608 A | 2/1999 | Allman et al. | 451/72 |
| 5,882,251 A | 3/1999 | Berman et al. | 451/527 |
| 5,888,120 A | 3/1999 | Doran | 451/41 |
| 5,893,756 A | 4/1999 | Berman et al. | 438/692 |
| 5,930,655 A | 7/1999 | Cooney, III et al. | |
| 5,931,719 A | 8/1999 | Nagahara et al. | 451/41 |
| 5,941,761 A | 8/1999 | Nagahara et al. | 451/56 |
| 5,944,585 A | 8/1999 | Nagahara et al. | 451/56 |
| 5,957,757 A | 9/1999 | Berman | 451/56 |
| 5,961,375 A | 10/1999 | Nagahara et al. | 451/41 |
| 5,985,679 A | 11/1999 | Berman | 438/7 |
| 5,989,998 A | 11/1999 | Sugahara et al. | |
| 5,990,010 A | 11/1999 | Berman | 438/691 |
| 6,043,145 A | 3/2000 | Suzuki et al. | |
| 6,054,379 A | 4/2000 | Yau et al. | |
| 6,063,702 A | 5/2000 | Chung | |
| 6,066,266 A | 5/2000 | Osugi et al. | 216/85 |
| 6,069,085 A | 5/2000 | Berman | 438/697 |

(List continued on next page.)

Primary Examiner—Matthew Smith
Assistant Examiner—Igwe Anya
(74) Attorney, Agent, or Firm—John P. Taylor

(57) ABSTRACT

A process is disclosed for planarizing a semiconductor substrate after filling isolation trenches in the substrate with dielectric material wherein the respective thicknesses of a liner layer of dielectric material blanket deposited over the upper surface of the substrate and in the trenches, and/or a filler layer of dielectric material blanket deposited over the liner layer to fill the trenches, may not be uniform. The planarization process include: removing portions of the filler layer over the liner layer on the upper surface of the substrate until portions of the underlying liner layer on the upper surface of the substrate are exposed; treating the exposed portions of the liner layer to inhibit removal of the exposed liner layer portions; continuing to remove the remainder of the filler layer on the liner layer over the upper surface of the substrate until all of the underlying liner layer on the upper surface of the substrate is exposed; and then removing the liner layer over the upper surface of the substrate and over the filler layer in the trenches until all of the liner layer is removed from the upper surface of the substrate; whereby removal of all of the filler layer on the liner layer over the upper surface of the substrate, while inhibiting removal of the liner layer over the upper surface of the substrate until such filler layer removal on the liner layer over the upper surface of the substrate is completed, will result in formation of a planarized surface on the upper surface of the substrate, and the upper surfaces of the filler layer and the liner layer in the trenches.

16 Claims, 3 Drawing Sheets

U.S. PATENT DOCUMENTS

| | | |
|---|---|---|
| 6,071,818 A | 6/2000 | Chisholm et al. ............ 438/692 |
| 6,074,288 A | 6/2000 | Nagahara et al. ............ 451/384 |
| 6,074,517 A | 6/2000 | Taravade .................... 156/345 |
| 6,077,783 A | 6/2000 | Allman et al. ............... 438/691 |
| 6,080,670 A | 6/2000 | Miller et al. ................. 438/691 |
| 6,215,087 B1 | 4/2001 | Akahori et al. |
| 6,362,035 B1 * | 3/2002 | Shih et al. ................... 438/199 |
| 6,436,835 B1 * | 8/2002 | Kido et al. ................... 438/693 |

* cited by examiner

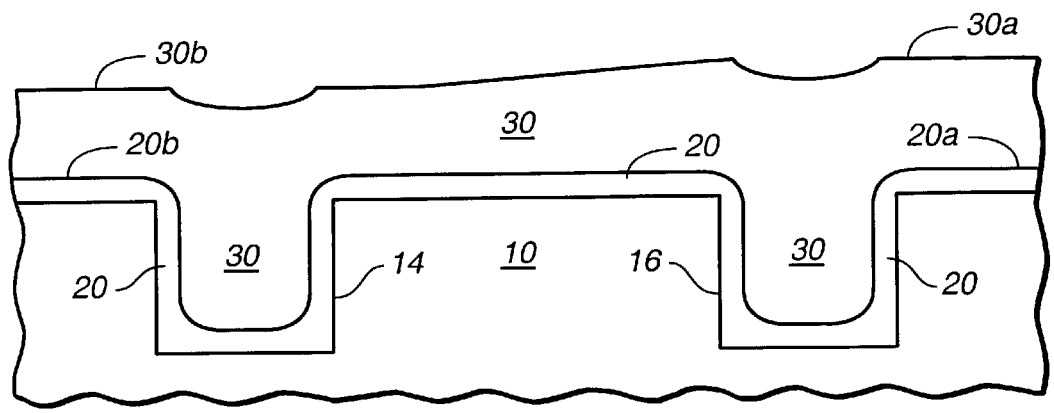
FIG._1 (PRIOR ART)
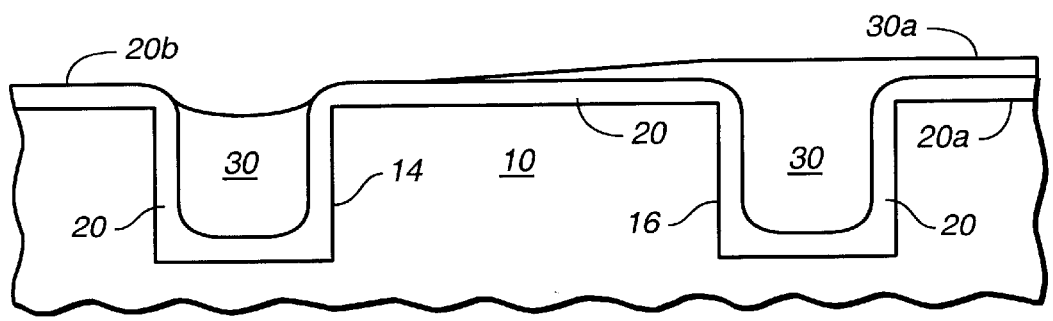
FIG._2 (PRIOR ART)
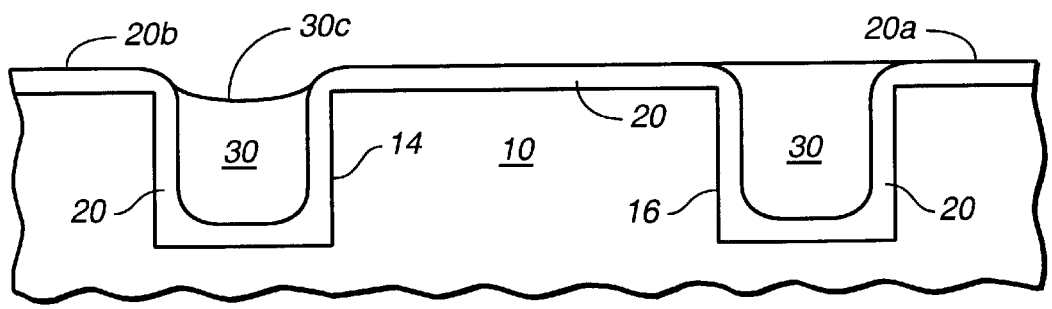
FIG._3 (PRIOR ART)

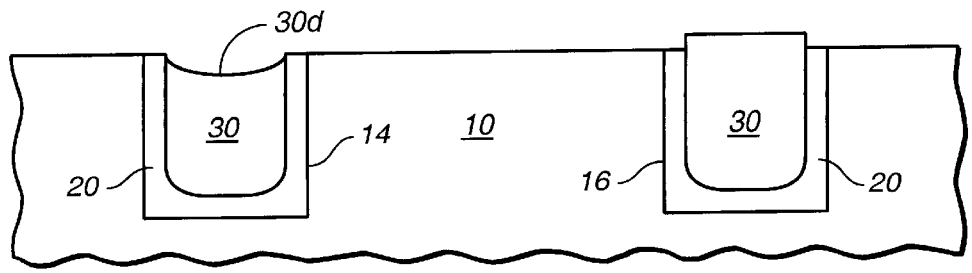
FIG._4 (PRIOR ART)
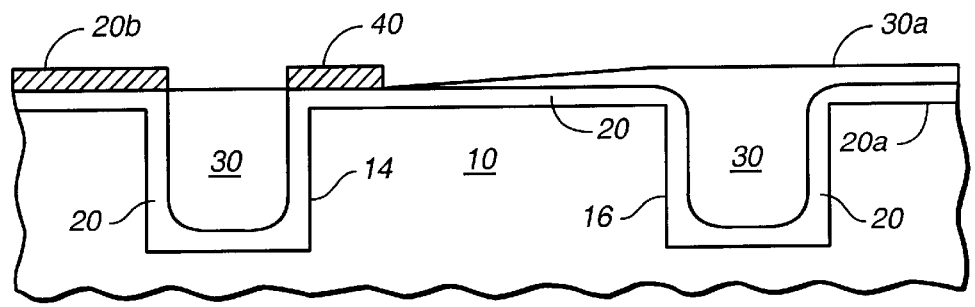
FIG._5
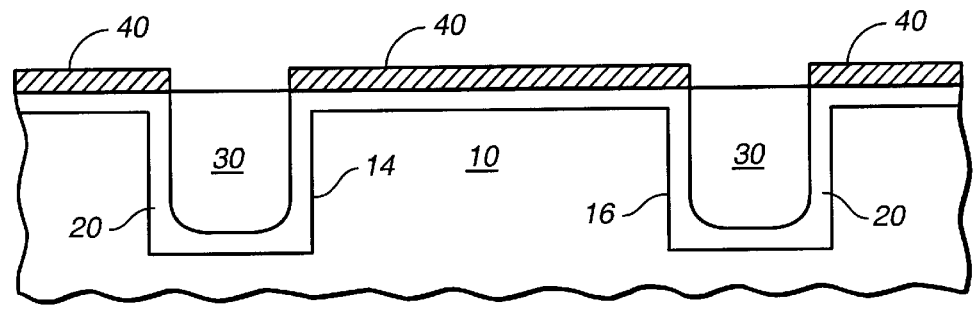
FIG._6
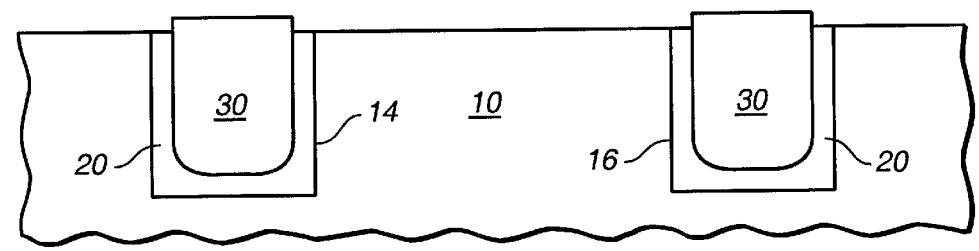
FIG._7

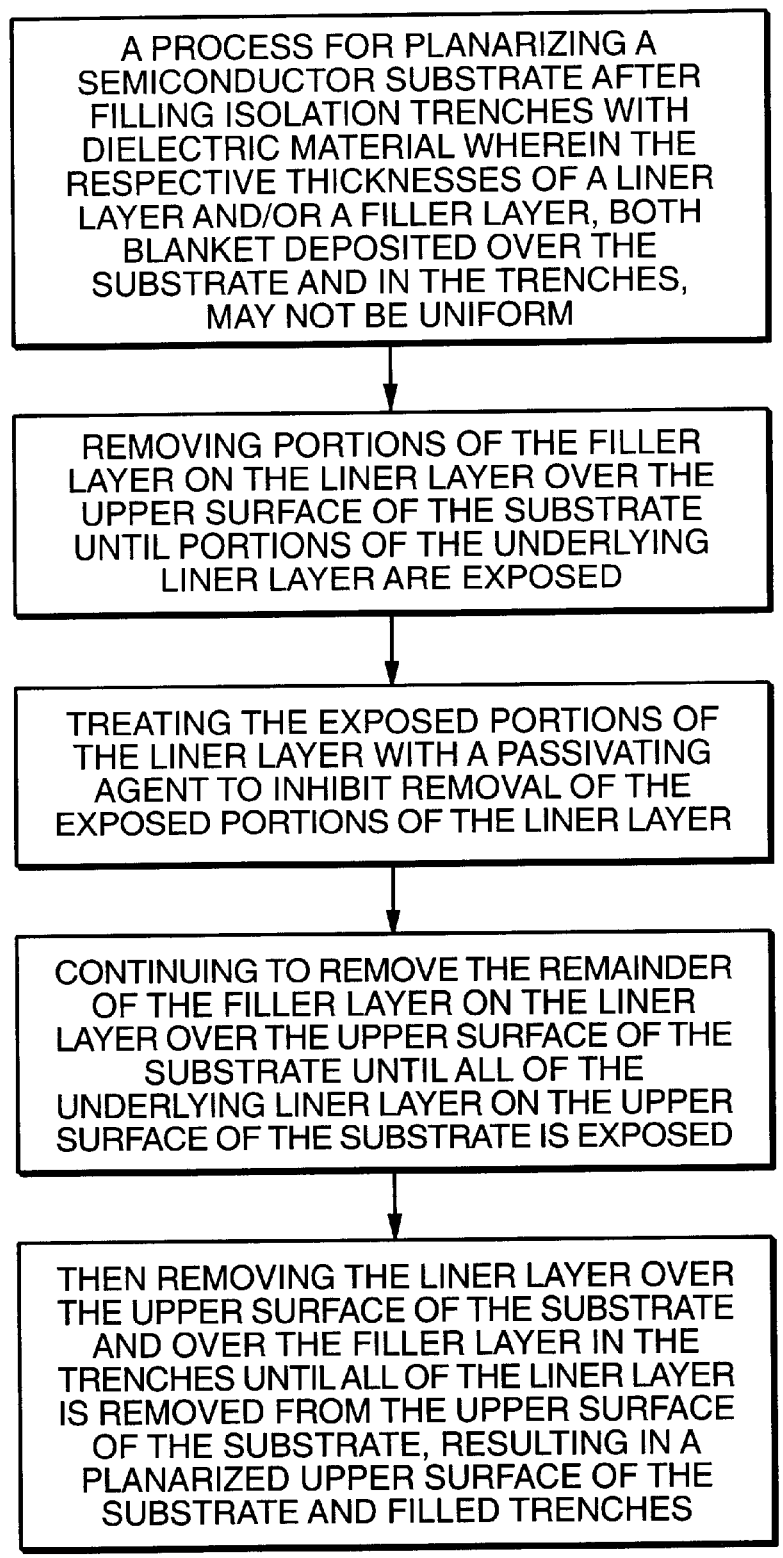
FIG._8

PROCESS FOR FORMING PLANARIZED ISOLATION TRENCH IN INTEGRATED CIRCUIT STRUCTURE ON SEMICONDUCTOR SUBSTRATE

BACKGROUND OF THE INVENTION

1. Field of the Invention

This invention relates to integrated circuit structures constructed on semiconductor substrates. More particularly, this invention relates to a process for forming planarized isolation trenches in an integrated circuit structure on a semiconductor substrate.

2. Description of the Related Art

In the construction of integrated circuit structures, dielectric materials such as, for example, silicon oxide ($SiO_2$) have been conventionally used to electrically separate and isolate or insulate conductive elements of the integrated circuit structure from one another. This has been carried out by growing field oxide on the surface of the semiconductor substrate, e.g, by growing silicon oxide on a silicon substrate. However, with continued shrinkage of the integrated circuit structures, more precise location of the electrical isolation regions has resulted in the formation of trenches in the semiconductor substrate which are then filled with electrical insulation material to provide the desired electrical isolation of active devices in the integrated circuit structure from one another.

Typically, when the semiconductor substrate is silicon, and a dielectric material such as silicon oxide is used as the filler material to provide the desired electrical insulation, a thin conformal layer of a different dielectric material capable of serving as an etch stop layer for the filler layer of dielectric material, such as silicon nitride, is first blanket deposited over the surface of the substrate and in the trenches as a liner material and etch stop. The remainder of each trench is then filled by blanket deposition of the filler layer of dielectric material over the liner layer on the substrate surface and in the trenches. The entire structure is then subjected to planarization such as, for example, a chemical-mechanical polish (CMP) process to remove the portions of both the liner layer and the filler layer lying on the surface of the semiconductor substrate, leaving only the liner material and the filler material in the trenches.

However, irregularities in the initial thicknesses of either the liner layer or the filler layer (or both) can occur, as shown in FIG. 1, in which a semiconductor substrate 10, hereinafter referred to as a silicon substrate by way of illustration and not of limitation, is shown having formed thereon isolation trenches 14 and 16. A liner layer 20 of dielectric material, hereinafter referred to as silicon nitride layer 20, by way of illustration and not of limitation, is first blanket deposited over the entire substrate surface, including the walls and bottom of trenches 14 and 16. A filler layer 30, hereinafter referred to as silicon oxide filler layer 30 by way of illustration and not of limitation, is then blanket deposited over silicon nitride liner 20.

In the illustrated structure of FIG. 1, it will be apparent that the right portion 30a of silicon oxide layer 30 is thicker than the left portion 30b of oxide layer 30. As a result, when the structure is subjected to a planarization process, such as, for example, a chemical-mechanical polish (CMP) process, silicon nitride 20b on the left side will become exposed, i.e., all of the overlying silicon oxide 30b will be removed, before all of the silicon oxide 30a is removed from over silicon nitride 20a on the right side of the illustrated structure in FIG. 2. While FIGS. 1 and 2 show a simplified version of the problem (for illustrative purposes only), it will be appreciated that such irregularities in thickness of either the silicon nitride layer or the silicon oxide layer can randomly occur all over the substrate.

As the prior art planarization process continues, the previously exposed silicon nitride illustrated at 20b in FIGS. 1 and 2 is then polished away while silicon oxide 30a continues to be removed from the thicker portions of the oxide/nitride layers shown on the right of FIG. 2, resulting in all of the silicon nitride and silicon oxide layers being removed at some locations on the surface of wafer 10, while silicon nitride 2a continues to be removed at other locations, as shown on the right in prior art FIG. 3. As the planarization then continues further, erosion of the top surface of the silicon oxide filler in the trench begins to occur in those location where the silicon nitride was prematurely exposed and removed, as seen at 30c in FIG. 3. By the time all of remaining silicon nitride 20a has been removed in the thicker regions, further erosion of layer 30 can result in a dishing of the top surface of the silicon oxide filler 30 in trench 14, as shown at 30d in prior art FIG. 4.

It would, therefore, be desirable to provide a planarization process which would remove the surface portions of a liner layer of dielectric material and a filler layer of a different dielectric material used to fill isolation trenches in a semiconductor substrate, while forming a planarized surface on the liner material and filler material remaining in the trenches, regardless of the initial uniformity in thickness of the liner and filler layers.

SUMMARY OF THE INVENTION

In a process for planarizing a semiconductor substrate after filling isolation trenches in the substrate with dielectric material wherein the respective thicknesses of a liner layer of dielectric material blanket deposited over the upper surface of the substrate and in the trenches, and/or a filler layer of dielectric material blanket deposited over the liner layer to fill the trenches, may not be uniform, the improvements which comprise:

a) removing portions of the filler layer over the liner layer on the upper surface of the substrate until portions of the underlying liner layer on the upper surface of the substrate are exposed;

b) treating the exposed portions of the liner layer to inhibit removal of the exposed liner layer portions;

c) continuing to remove the remainder of the filler layer on the liner layer over the upper surface of the substrate until all of the underlying liner layer over the upper surface of the substrate is exposed; and d) then removing the liner layer over the upper surface of the substrate and over the filler layer in the trenches until all of the liner layer is removed from the upper surface of the substrate;

whereby removal of all of the filler layer on the liner layer over the upper surface of the substrate, while inhibiting removal of the liner layer over the upper surface of the substrate until such filler layer removal on the liner layer over the upper surface of the substrate is completed, will result in formation of a planarized surface on the upper surface of the substrate and the upper surfaces of the filler layer and the liner layer in the trenches.

BRIEF DESCRIPTION OF THE DRAWINGS

FIG. 1 is a fragmentary vertical cross-sectional view of a prior art structure showing isolation trenches formed in a semiconductor substrate, and a liner layer and a filler layer formed over the substrate and filling the trenches.

FIG. 2 is a fragmentary vertical cross-sectional view of the prior art structure of FIG. 1 showing partial removal of the filler layer on the liner layer over the upper surface of the substrate during a prior art planarization process.

FIG. 3 is a fragmentary vertical cross-sectional view of the prior art structure of FIG. 2 showing complete removal of the filler layer on the liner layer over the upper surface of the substrate and partial removal of the liner layer during a prior art planarization process.

FIG. 4 is a fragmentary vertical cross-sectional view of the prior art structure of FIG. 3 showing complete removal of the liner layer over the upper surface of the substrate, and erosion of the upper surface of the filler material in one of the trenches during a prior art planarization process.

FIG. 5 is a fragmentary vertical cross-sectional view of the structure of FIG. 2 after treatment of the exposed portions of the surface of the liner layer, in accordance with the planarization process of the invention.

FIG. 6 is a fragmentary vertical cross-sectional view of the structure of FIG. 5 after complete removal of the filler material on the liner layer over the upper surface of the substrate and complete treatment of the surface of the liner layer, in accordance with the planarization process of the invention.

FIG. 7 is a fragmentary vertical cross-sectional view of the structure of FIG. 6 after removal of all of the liner layer over the upper surface of the substrate, in accordance with the planarization process of the invention.

FIG. 8 is a flowsheet illustrating the process of the invention.

DETAILED DESCRIPTION OF THE INVENTION

The invention comprises an improved process for planarizing a semiconductor substrate after filling isolation trenches in the substrate with dielectric material wherein the respective thicknesses of a liner layer of dielectric material blanket deposited over the upper surface of the substrate and in the trenches, and/or a filler layer of dielectric material blanket deposited over the liner layer to fill the trenches, may not be uniform.

The improvements in the process comprise:
a) removing portions of the filler layer over the liner layer on the upper surface of the substrate until portions of the underlying liner layer on the upper surface of the substrate are exposed;
b) treating the exposed portions of the liner layer to inhibit removal of the exposed liner layer portions;
c) continuing to remove the remainder of the filler layer on the liner layer over the upper surface of the substrate until all of the underlying liner layer on the upper surface of the substrate is exposed; and
d) then removing the liner layer over the upper surface of the substrate and over the filler layer in the trenches until all of the liner layer is removed from the upper surface of the substrate;
whereby removal of all of the filler layer on the liner layer over the upper surface of the substrate, while inhibiting removal of the liner layer over the upper surface of the substrate until such filler layer removal on the liner layer over the upper surface of the substrate is completed, will result in formation of a planarized surface on the upper surface of the substrate, and the upper surfaces of the filler layer and the liner layer in the trenches.

The semiconductor substrate may comprise any semiconductor material such as a group IV (Ge or Si) semiconductor, a group III (Al, Ga, or In)-group V (P, As, or Sb) semiconductor, or a group II (Zn, Cd, Hg)-group VI (S, Se, Te)-VI semiconductor. Typically the semiconductor substrate will comprise a silicon substrate. The substrate will hereinafter be referred to as a silicon substrate by way of illustration and not of limitation.

The isolation trenches formed in the silicon substrate may range in depth of from about 250 nanometers (nm) to about 350 nm, and typically will be about 300 nm in depth. The width of the isolation trenches will typically range from about 0.1 micrometer ($\mu$m) to about 500 $\mu$m, and the spacing between adjacent isolation trenches may typically range from as little as 0.1 $\mu$m to as much as 2.5 millimeter (mm).

The dielectric material used as the filler material or layer in the trenches may comprise any dielectric material capable of providing the desired electrical insulation and isolation between active devices formed in the substrate and separated from one another by the isolation trench. Typically, when the substrate comprises silicon, the dielectric filler material used to fill the isolation trenches will comprise silicon oxide. The filler material will hereinafter be referred to as silicon oxide by way of illustration and not of limitation. The blanket deposition of the silicon oxide filler material over the liner layer and into the trenches to fill up the trenches may be carried out by any deposition process capable of completely filling the trenches, such as by CVD, PECVD, or PVD. The silicon oxide filler layer may range in thickness from about 500 nm to about 700 nm, and typically will be about 600 nm.

The dielectric material used as the liner material must be a dielectric material having different etch characteristics from the dielectric material used as the filler material to thereby permit the dielectric liner material to function as an etch stop during a planarization step to remove the excess silicon oxide filler material not in the trenches. Typically, when the substrate comprises silicon, and the filler material used to fill the isolation trenches comprises silicon oxide, the dielectric material used as the liner material will comprise silicon nitride. The liner material will, therefore, hereinafter be referred to as silicon nitride by way of illustration and not of limitation. The blanket deposition of the silicon nitride liner material over the upper surface of the silicon substrate and into the trenches may be carried out by any deposition process, such as by CVD, PECVD, or PVD. Typically, the silicon nitride liner may range in thickness from about 100 nm to about 150 mn.

After the deposition of both the layer silicon nitride liner material and the layer of silicon oxide filler material in the trenches, and on the top surface of the silicon substrate, the structure is subjected to a planarization process to remove all of the silicon oxide on the silicon nitride layer over the upper surface of the substrate and to also remove all of the silicon nitride layer on the upper surface of the substrate.

This planarization process is typically carried out at least in part by a chemical-mechanical polish (CMP) process which combines chemical etching with mechanical abrasion, using a polishing slurry containing an etch material and an abrasive. Typically, to remove silicon oxide by CMP, a slurry containing silica and KOH or $NH_4OH$ is used. Such polishing slurries are commercially available, for example from the Cabot Company as SS12.

In accordance with one aspect of the invention, the silicon nitride liner material is treated with a passivating agent to reduce its chemical reactivity with the slurry used to remove the silicon oxide filler material. This permits complete removal of the silicon oxide filler layer on the liner layer over the upper surface of the substrate before any substantial removal of the silicon nitride liner layer over the upper surface of the substrate commences. Examples of passivating agents which may be used to treat the silicon nitride surfaces to promote selective removal of silicon oxide, while inhibiting removal of silicon nitride by the same chemical etchants include carboxylates.

By use of the term "passivating agent" herein is meant a chemical compound which, when applied to the surface of a material, alters at least the surface of that material in a manner which will reduce its chemical reactivity.

The upper surface of the silicon liner layer may be treated with the passivating agent in two ways. The passivating agent may be applied to exposed surfaces of the underlying silicon nitride liner layer as such surfaces begin to appear during the CMP removal of the overlying silicon oxide filler layer on the portion of the liner layer over the upper surface of the substrate. This can be carried out, for example, using optical monitoring to ascertain the exposure of the underlying silicon nitride surface, at which time, the CMP process could be interrupted, the surface treated with the passivating agent, and the polishing process recommenced. This passivation treatment could be carried out several times during the CMP process, with the exact number of such passivation treatments being empirically determined.

The passivation treatment may also be carried out dynamically (continuously during polishing) by selecting a passivating agent which would be compatible with the chemical constituents of the slurry, and then adding the passivating agent to the slurry so that exposure of the silicon nitride liner layer, during the polishing of the overlying silicon oxide filler layer, would result in immediate treatment of the exposed surface of the silicon nitride layer to thereby inhibit further chemical reaction between the exposed silicon nitride surfaces and the etchants in the slurry. Such mixtures of a silicon oxide polishing slurry and passivating agent are commercially available. For example, silicon oxide polishing slurries are commercially available from Hitachi which respectively contain no passivating agent (HS-8005) and a passivating agent (HS-8102GP). The Cabot Company is another commercial source of silicon oxide polishing slurries respectively containing no passivating agent (EP-STI120010SN-A) and containing a passivating agent (EP-STI120010SN-B). In such cases, the polishing slurry containing no passivating agent would be initially used until exposure of the underlying silicon nitride surface commenced, in which case the slurry would be changed to the slurry containing the passivating agent.

FIGS. 5–7 illustrate use of the passivating agent in the improved process of the invention. In FIG. 5, treatment of the partially exposed upper surface of silicon nitride liner 20 by the passivating agent is shown at 40; while FIG. 6 illustrates, at 40, treatment of all of the upper surface of silicon nitride liner layer 20 with the passivating agent. It should be noted that the illustrated thickness of the passivated upper surface of the exposed silicon nitride layer at 40 has been greatly exaggerated for illustrative purposes only. It will be readily appreciated by those skilled in the art that this is only a surface treatment with very little penetration into the silicon nitride beyond the surface.

After all of the upper silicon oxide filler layer has been removed from the upper surface of the silicon nitride liner layer over the upper surface of the substrate, as ascertained, for example, by optical monitoring, the slurry may be changed to a slurry having etchants therein which will react with both the silicon oxide in the trench as well as the remaining portions of the silicon nitride liner layer still over the upper surface of the substrate.

The remaining silicon nitride may also be removed from the substrate surface by changing the slurry to one containing only abrasives, with no chemicals to thereby, in essence, grind away the remainder of the silicon nitride layer on the upper surface of the substrate.

Preferably, however, the remaining silicon nitride on the upper surface of the substrate is removed by terminating the CMP process after all of the silicon oxide on the silicon nitride over the upper surface of the substrate has been removed. The substrate is then removed from the CMP apparatus or station, washed to remove slurry residues, and then briefly treated in phosphoric acid to remove the remaining silicon nitride on the upper surface of the substrate.

The phosphoric acid should be at least 50%, preferably at least 75%, phosphoric acid in concentration, and the phosphoric acid bath should be heated to a temperature of at least about 100° C., and preferably to a temperature ranging from about 130° C. to about 170° C., and typically to a temperature of about 150° C. The treatment time will be dependent upon the thickness of the remaining silicon nitride layer over the upper surface of the substrate. For a thickness of about 120 nm, the residence time in the hot phosphoric acid bath should be about 20 minutes.

Regardless of the method selected for removal of the silicon nitride layer, the removal of all of the silicon nitride liner layer at the same time results in the planarized surface shown in FIG. 7. The use of the passivating agent in the process, in accordance with the invention, inhibits premature removal of portions of the silicon nitride liner layer before removal of all of the silicon oxide layer formed on the silicon nitride layer over the upper surface of the substrate, and results in a planarized surface, with little if any erosion of the top surface of the silicon oxide filler in the trenches.

To further illustrate the process of the invention, identical patterns of 300 nm deep isolation trenches may be formed on two silicon substrates. A 125 nm thick layer of silicon nitride may be blanket deposited over the surface and in the trenches of each substrate by PECVD, and a 600 nm layer of silicon oxide may then be blanket deposited by PECVD over each of the silicon nitride layers and into the trenches, filing all of the trenches. Each of the two substrates may then be subjected to a CMP process, using a slurry containing silica particles and KOH, but no passivating agent, such as the aforementioned Hitachi HS-8005 and Cabot Company EP-STI120010SN-A slurries.

Progress of the polishing process may then be optically monitored for each substrate. Upon indication by the optical monitor of the exposure of the underlying silicon nitride, the CMP process may be stopped for each substrate. The polishing slurry for one of the substrates is then changed to substitute a silicon oxide polishing slurry which also contains a passivating agent such as the prior mentioned Hitachi HS-8102GP or Cabot Company EP-STI120010SN-B slurries.

The polishing process is then recommenced for each substrate. For each substrate, when the optical monitor indicates that all silicon oxide had been removed from the silicon nitride surfaces over the upper surface of the substrate, the CMP process would be stopped, and the substrate removed and washed to remove the slurry residues in each case. Each of the two substrates may then be immersed for about 20 minutes in a 160° C., 100% phosphoric acid bath to remove all remaining silicon nitride over the upper surface of the substrate. The respective substrates are then each removed from the phosphoric acid bath, rinsed, dried, and then examined. The substrate treated with the passivating agent to inhibit removal of the silicon nitride liner layer during the removal of the silicon oxide layer in accordance with the invention will be observed to be planarized with no indications of erosion of the silicon oxide surfaces of the filled trenches. However, the other substrate, which was not treated with the passivation agent, will exhibit dishing of the oxide surfaces in the trenches.

Thus, the invention provides an improved process for the planarization of isolation trenches wherein uneven thicknesses of the dielectric materials used to fill the trenches can be compensated for by treating the exposed surfaces of the underlying dielectric layer to inhibit etching of such layer to permit complete removal of the upper layer of dielectric layer over the upper surface of the substrate before commencement of the removal of the lower layer of dielectric material over the upper surface of the substrate, thereby enhancing the planarity of the resultant structure.

Having thus described the invention what is claimed is:

1. In a process for planarizing a semiconductor substrate after filling isolation trenches in said substrate with dielectric material wherein the respective thicknesses of a liner layer of dielectric material blanket deposited over the upper surface of said substrate and in said trenches, and/or a filler layer of dielectric material blanket deposited on said liner layer to fill said trenches, may not be uniform, the improvements which comprise:

a) removing portions of said filler layer on said liner layer over said upper surface of said substrate until portions of said underlying liner layer on said upper surface of said substrate are exposed;

b) optically monitoring said removal of portions of said filler layer to determine the presence of exposed portions of said underlying liner layer;

c) treating said exposed portions of said liner layer to inhibit removal of said exposed portions of said liner layer;

d) continuing to remove the remainder of said filler layer on said liner layer over said upper surface of said substrate while optically monitoring said removal of filler material until all of said underlying liner layer over said upper surface of said substrate is exposed; and e) then removing said liner layer over said upper surface of said substrate until all of said liner layer is removed from said upper surface of said substrate;

whereby removal of all of said filler layer on said liner layer over said upper surface of said substrate, while optically monitoring said removal of the filler layer and treating said exposed portions of said liner layer to inhibit removal of said liner layer over said upper surface of said substrate until removal of said filler layer on said liner layer over said upper surface of said substrate is completed, results in formation of a planarized surface on said upper surface of said substrate and the upper surfaces of said filler layer and said liner layer in said trenches.

2. The process of claim 1 wherein said treating step further comprises contacting said exposed portions of said liner layer with a passivating agent to inhibit removal of said exposed portions of said liner layer by reducing the chemical reactivity of said exposed portions.

3. The process of claim 2 wherein said steps of removing said filler layer on said liner layer over said upper surface of said substrate further comprise using a chemical-mechanical polish (CMP) process to remove said filler layer.

4. The process of claim 3 wherein said filler layer of dielectric material comprises silicon oxide ($SiO_2$).

5. The process of claim 4 wherein said CMP process utilizes a slurry comprising at least one abrasive and at least one chemical selected from the group consisting of KOH, $NH_4OH$, and mixtures thereof to remove said filler layer of silicon oxide material.

6. The process of claim 3 wherein said liner layer of dielectric material comprises silicon nitride ($Si_3N_4$).

7. The process of claim 6 wherein said step of removing said liner layer of silicon nitride over said upper surface of said substrate further comprises polishing said silicon nitride liner layer with a slurry containing an abrasive until all of said silicon nitride over said upper surface of said substrate is removed.

8. In a process for planarizing a silicon substrate after filling isolation trenches in said substrate with dielectric material wherein the respective thicknesses of a liner layer of silicon nitride dielectric material blanket deposited over the upper surface of said substrate and in said trenches, and/or a filler layer of silicon oxide dielectric material blanket deposited on said liner layer to fill said trenches, may not be uniform, the improvements which comprise:

a) removing portions of said silicon oxide filler layer on said silicon nitride liner layer over said upper surface of said silicon substrate by a chemical-mechanical polish (CMP) process until portions of said underlying silicon nitride liner layer on said upper surface of said substrate are exposed;

b) optically monitoring said removal of portions of said filler material to determine the presence of exposed portions of said underlying liner layer;

c) treating said exposed portions of said silicon nitride liner layer with a passivating agent to reduce the chemical reactivity of said treated portions of said silicon nitride liner layer to thereby inhibit removal of said exposed portions of said liner layer;

d) continuing to remove the remainder of said silicon oxide filler layer on said silicon nitride liner layer over said upper surface of said substrate while optically monitoring said removal of filler material with said CMP process until all of said underlying liner layer over said upper surface of said substrate is exposed; and e) then removing said silicon nitride liner layer over said upper surface of said substrate until all of said liner layer is removed from said upper surface of said substrate;

whereby removal of all of said silicon oxide filler layer on said silicon nitride liner layer over said upper surface of said silicon substrate, while optically monitoring said removal of the filler layer and treating said exposed portions of said liner layer to inhibit removal of said liner layer over said upper surface of said substrate until removal of said filler layer on said liner layer over said upper surface of said substrate is completed, results in formation of a planarized surface on said upper surface of said silicon substrate and the upper surfaces of said silicon oxide filler layer and said silicon nitride liner layer in said trenches.

9. The process of claim 8 wherein said passivating agent consists essentially of a carboxylate.

10. The process of claim 8 wherein said CMP process utilizes a slurry comprising at least one abrasive and at least one chemical selected from the group consisting of KOH, $NH_4OH$, and mixtures thereof to remove said filler layer of silicon oxide material.

11. The process of claim 10 wherein said at least one abrasive in said CMP process comprises silica particles.

12. The process of claim 8 wherein said step of removing said liner layer of silicon nitride over said upper surface of said substrate further comprises contacting said silicon nitride liner layer with phosphoric acid until all of said silicon nitride over said upper surface of said substrate is removed.

13. The process of claim 8 wherein said step of removing said liner layer of silicon nitride over said upper surface of said substrate further comprises polishing said silicon nitride liner layer with a slurry containing an abrasive until all of said silicon nitride over said upper surface of said substrate is removed.

14. In a process for planarizing a silicon substrate after filling isolation trenches in said substrate with dielectric material wherein the respective thicknesses of a liner layer of silicon nitride dielectric material blanket deposited over the upper surface of said substrate and in said trenches, and/or a filler layer of silicon oxide dielectric material blanket deposited on said liner layer to fill said trenches, may not be uniform, the improvements which comprise:
   a) removing portions of said silicon oxide filler layer on said silicon nitride liner layer over said upper surface of said silicon substrate by a chemical-mechanical polish (CMP) process using a slurry containing a silica abrasive and at least one chemical etchant selected from the group consisting of KOH, NH$_4$OH and mixtures thereof, until portions of said underlying silicon nitride liner layer on said upper surface of said substrate are exposed;
   b) optically monitoring said removal of portions of said filler material to determine the presence of exposed portions of said underlying silicon nitride liner layer;
   c) treating said exposed portions of said silicon nitride liner layer with a passivating agent to reduce the chemical reactivity of said treated portions of said silicon nitride liner layer to thereby inhibit removal of said exposed portions of said liner layer;
   d) continuing to remove the remainder of said silicon oxide filler layer on said silicon nitride liner layer over said upper surface of said substrate with said CMP process, while optically monitoring said removal of said filler material, until all of said underlying liner layer over said upper surface of said substrate is exposed; and
   e) then removing said silicon nitride liner layer over said upper surface of said substrate by, contacting said silicon nitride with phosphoric acid, until all of said liner layer is removed from said upper surface of said substrate;
whereby removal of all of said silicon oxide filler layer on said silicon nitride liner layer over said upper surface of said silicon substrate, while optically monitoring said removal of the filler layer and treating said exposed portions of said liner layer to inhibit removal of said liner layer over said upper surface of said substrate until removal of said filler layer on said liner layer over said upper surface of said substrate is completed, results in formation of a planarized surface on said upper surface of said silicon substrate and the upper surfaces of said silicon oxide filler layer and said silicon nitride liner layer in said trenches.

15. The process of claim 14 wherein said step of treating said exposed portions of said silicon nitride liner layer with a passivating agent further comprises subjecting said substrate to further CMP processing using a slurry containing said passivating agent to permit contacting said exposed portions of said liner layer with said passivating agent while carrying out said CMP process.

16. In a process for planarizing a semiconductor substrate after filling isolation trenches in said substrate with dielectric material wherein the respective thicknesses of a liner layer of dielectric material blanket previously deposited over the upper surface of said substrate and in said trenches, and/or a filler layer of dielectric material blanket subsequently deposited on said liner layer to fill said trenches, may not be uniform, the improvements which comprise:
   a) chemically and mechanically polishing (CMP) said coated structure to remove portions of said filler layer on said liner layer over said upper surface of said substrate until portions of said underlying liner layer on said upper surface of said substrate are exposed;
   b) optically monitoring said structure during said CMP process to determine the presence of exposed portions of said liner layer beneath said filler layer;
   c) stopping said CMP planarizing process when said optical monitoring indicates the exposure of portions of said liner layer;
   d) treating said exposed portions of said liner layer to inhibit removal of said exposed portions of said liner layer;
   e) recommencing said CMP planarization process to remove further portions of said filler layer on said liner layer over said upper surface of said substrate while optically monitoring such removal for exposure of further portions of said liner layer;
   f) repeating steps a–e until all of said underlying liner layer over said upper surface of said substrate is exposed, and all of said filler layer overlying the upper surface of said liner layer over said substrate has been removed; and
   g) then removing said liner layer over said upper surface of said substrate until all of said liner layer is removed from said upper surface of said substrate;
whereby removal of all of said filler layer on said liner layer over said upper surface of said substrate, while inhibiting removal of said liner layer over said upper surface of said substrate until removal of said filler layer on said liner layer over said upper surface of said substrate is completed, results in formation of a planarized surface on said upper surface of said substrate and the upper surfaces of said filler layer and said liner layer in said trenches.

* * * * *